United States Patent [19]

Beyer et al.

[11] Patent Number: 5,234,535

[45] Date of Patent: Aug. 10, 1993

[54] METHOD OF PRODUCING A THIN SILICON-ON-INSULATOR LAYER

[75] Inventors: Klaus D. Beyer, Poughkeepsie; Louis L. Hsu, Fishkill; Victor J. Silvestri, Hopewell Junction; Andrie S. Yapsir, Pleasane Valley, all of N.Y.

[73] Assignee: International Business Machines Corporation, Armonk, N.Y.

[21] Appl. No.: 988,655

[22] Filed: Dec. 10, 1992

[51] Int. Cl.[5] .......................................... H01L 21/306
[52] U.S. Cl. ..................................... 156/630; 437/62; 437/225; 437/974; 148/DIG. 12; 148/DIG. 135; 156/633; 156/643
[58] Field of Search ............ 437/62, 225, 974; 148/DIG. 12, DIG. 135, DIG. 150; 156/630, 633, 643

[56] References Cited

U.S. PATENT DOCUMENTS

| | | | |
|---|---|---|---|
| 4,169,000 | 9/1979 | Riseman | 148/187 |
| 4,230,505 | 10/1980 | Wu | 437/974 |
| 4,549,627 | 3/1987 | Abernathey et al. | 29/571 |
| 4,851,078 | 7/1989 | Short et al. | 437/62 |
| 4,897,362 | 1/1990 | Delgado et al. | 437/26 |
| 4,962,062 | 10/1990 | Uchiyama et al. | 437/225 |
| 4,968,628 | 11/1990 | Delgado et al. | 437/21 |
| 5,013,681 | 5/1991 | Codbey et al. | 437/62 |
| 5,034,343 | 7/1991 | Rouse et al. | 148/DIG. 135 |

FOREIGN PATENT DOCUMENTS

| | | | |
|---|---|---|---|
| 0144657 | 6/1989 | Japan | 148/DIG. 12 |
| 0218961 | 1/1990 | Japan . | |
| 3050817 | 3/1991 | Japan . | |

OTHER PUBLICATIONS

"Fabrication of Bond and Etch-Back Silicon on Insulator Using a Strained $Si_{0.7}Ge_{0.3}$ Layer as an Etch Stop" by D. Godbey et al., J. Electrochem. Soc., vol. 137, No. 10, Oct. 1990.

"A New Thinning Method for Obtaining Less than 100-nm-Thick Si Film on Wafer Bonding" by K. Imai, Jap. Journal of App. Phys., vol. 30, No. 6, 1991.

(List continued on next page.)

Primary Examiner—Brian E. Hearn
Assistant Examiner—Trung Dang
Attorney, Agent, or Firm—Michael J. Balconi-Lamica

[57] ABSTRACT

A method of forming a thin silicon SOI layer by wafer bonding, the thin silicon SOI layer being substantially free of defects upon which semiconductor structures can be subsequently formed, is disclosed. The method comprises the steps of:

a) providing a first wafer comprising a silicon substrate of a first conductivity type, a diffusion layer of a second conductivity type formed thereon and having a first etch characteristic, a thin epitaxial layer of the second conductivity type formed upon the diffusion layer and having a second etch characteristic different from the first etch characteristic of the diffusion layer, and a thin oxide layer formed upon the thin epitaxial layer;

b) providing a second wafer comprising a silicon substrate having a thin oxide layer formed on a surface thereof;

c) wafer bonding said first wafer to said second wafer;

d) removing the silicon substrate of said first wafer in a controlled mechanical manner; and e) removing the diffusion layer of said first wafer using a selective dry low energy plasma process to expose the underlying thin epitaxial layer, the selective dry low energy plasma process providing an etch ratio of the first etch characteristic to the second etch characteristic such that the diffusion layer is removed with minimal formation of any shallow plasma radiation damage to the exposed underlying thin epitaxial layer.

24 Claims, 6 Drawing Sheets

OTHER PUBLICATIONS

"Characterization of IC Devices Fabricated in Low Temperature (550° C.) Epitaxy by UHV/CVD Technique" by T. Nguyen et al., Proceedings of the International Electron Devices Meeting, Los Angeles, CA, Dec. 7-10, 1986.

"Silicon-on-Insulator (SOI) by Bonding and Etch-Back" by J. Lasky et al., IEDM 85, CH2252-5/85/00-00-0684, 1985 IEEE, pp. 684-687.

"Wafer Bonding for Silicon-on-Insulator Technologies" by J. Lasky, 1986 American Institute of Physics, Appl. Phys. Lett. 48 (1), Jan. 6, 1986.

"High-Performance Fully Depleted Silicon-on-Insulator Transistors" by T. MacElwee et al., IEEE Trans. on Electron Dev., vol. 37, 6, Jun. 1990.

"Epitaxial Film Transfer Technique for Producing Single Crystal Si Film on an Insulating Substrate" by M. Kimura et al., Appl. Phys. Lett. 43 (3), Aug. 1, 1983.

"Fabricating Rad-Hard SIMOX SRAMs" by M. Guerra et al., 176/Semiconductor International, May 1990.

"Controlled Preferential Etching Technology" by H. Muraoka et al., Semiconductor Silicon 1973, pp. 327-338.

"Low-Temperature Silicon Epitaxy by Ultrahigh Vacuum/Chemical Vapor Deposition" by B. Meyerson, Appl. Phys. Lett. 48, (12), Mar. 24, 1986.

METHOD OF PRODUCING A THIN SILICON-ON-INSULATOR LAYER

BACKGROUND OF THE INVENTION

1. Field of the Invention

The present invention relates to wafer structures and a method of making the same. More particularly, the invention relates to a method of forming a silicon-on-insulator structure.

2. Description of Related Art

Extensive work has been done on the thinning of silicon on wafers bonded by oxide. For instance, the thinning of silicon has been accomplished by wet silicon etches such as a mixture of HF, $HNO_3$ and $CH_3COOH$. Other wet silicon etches include a mixture of KOH, $K_2Cr_2O_7$, propanol and water as disclosed in D.J. Godbey et al., ECS, Vol. 137, p. 3219 (1990). Yet another wet silicon etch includes a mixture of ethylenediamine-pyrocatechol-water as discussed in K. Ima, Jap. J. Appl. Phys. 30, p. 1154, (1991). The disadvantage of silicon etches is the formation of etch pits at dislocation sites during extensive etch back. By placing an effective wet etching stop layer between the device silicon and the bulk of the silicon wafer, the topographic effects of the etch pits can be reduced. However, the insertion of etch stop layers can produce dislocations in the device silicon by the propagation of dislocations from the stop layer into the device silicon layer during the high temperature (1100° C.) wafer bonding process.

It would thus be desirable to provide a method of thinning silicon on wafers bonded by oxide which eliminates the above-mentioned etch pits caused by dislocation sites, and the dislocation propagation.

SUMMARY OF THE INVENTION

An object of the present invention is to provide a novel thinning process for silicon on oxide bonded wafers without the application of wet silicon etch back techniques.

According to the invention, a method of forming a thin semiconductor layer substantially free of defects upon which semiconductor structures can be subsequently formed, comprises the steps of:

a) providing a first wafer comprising a silicon substrate of a first conductivity type, a diffusion layer of a second conductivity type formed thereon and having a first etch characteristic, a thin epitaxial layer of the second conductivity type formed upon the diffusion layer and having a second etch characteristic different from the first etch characteristic of the diffusion layer, and a thin oxide layer formed upon the thin epitaxial layer;

b) providing a second wafer comprising a silicon substrate having a thin oxide layer formed on a surface thereof;

c) wafer bonding said first wafer to said second wafer;

d) removing the silicon substrate of said first wafer in a controlled mechanical manner; and e) removing the diffusion layer of said first wafer using a selective low energy dry plasma process to expose the underlying thin epitaxial layer, the selective dry plasma process providing an etch ratio of the first etch characteristic to the second etch characteristic such that the diffusion layer is removed with minimal formation of any shallow plasma radiation damage to the exposed underlying thin epitaxial layer.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, wherein like numerals are used for like references, and in which.

DETAILED DESCRIPTION OF THE PREFERRED EMBODIMENTS

Figure 1:
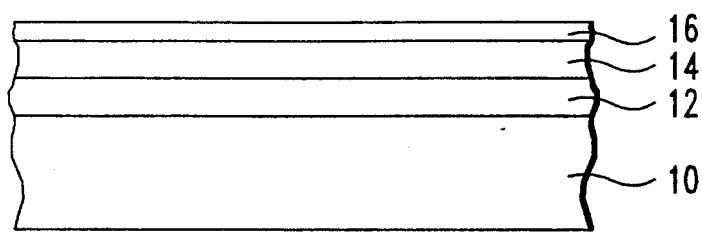
FIGS. 1 thru 7 are cross-sectional views of first and second silicon substrates at various process steps according to a first embodiment of the present invention.

Referring now to FIG. 1, the method of the present invention begins with a first semiconductor substrate or silicon wafer 10. Wafer 10 can comprise, for example, a P− or an N− substrate. An N+ diffusion layer 12, having a first etch characteristic, is formed on wafer 10 by any conventional means. Preferably, diffusion layer 12 comprises an extended subcollector diffusion layer and forms a 2 to 3 $\mu$m wide N+region. In addition to diffusion layer 12, a thin N− doped epitaxial layer 14, having a second etch characteristic and a thickness between 0.05 to 2 $\mu$m, is formed upon diffusion layer 12 by any well known Low Temperature silicon Epitaxial (LTE) process for preventing any significant N+ outdiffusion from the underlying N+ layer into the epitaxial N− layer. For example, a LTE process as described in T.N. Nguyen et al., "Characterization of IC Devices Fabricated in Low Temperature (550° C.) Epitaxy by UHV/CVD Technique", IEDM 86, pp. 304–307 (1986) and further described in "Low Temperature Silicon Epitaxy by Ultrahigh Vacuum/Chemical Vapor Deposition" by B.S. Meyerson, Appl. Phys. Lett. 48 (12), Mar. 24, 1986, pp. 797–799, can be used. The LTE process is characterized by a temperature range of approximately 550°–650° C. and prevents any outdiffusion from an underlying diffusion layer during the epitaxial growth of the silicon layer. Diffusion typically occurs at temperatures greater than 850° C. Thus, as a result of the low temperature epitaxial process, N+ outdiffusion during the formation of the N− epi layer 14 is controlled to maintain a tight N+ diffusion layer 12 while producing a high quality N− epitaxial layer 14. Layers 14 and 12 are further characterized in that the second etch characteristic of layer 14 is different from the first etch characteristic of layer 12, to be explained hereafter. Still further, a thin oxide layer 16 comprising, for example, $SiO_2$ is formed upon the thin epitaxial layer 14.

Figure 2:
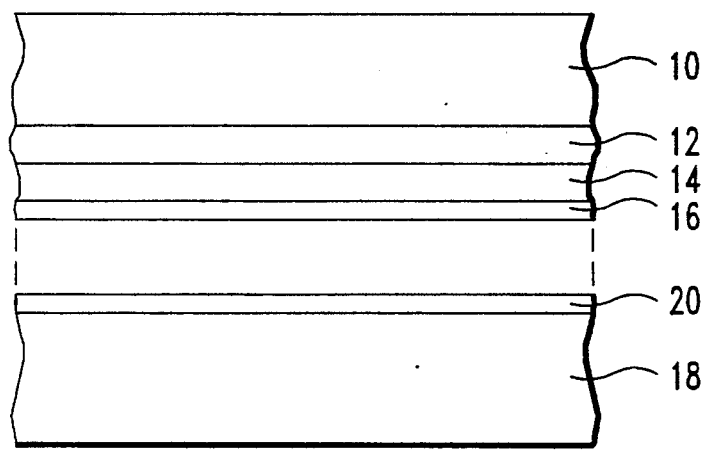
Figure 3:
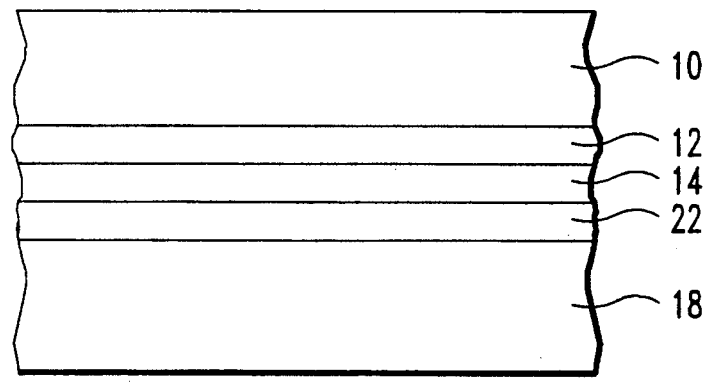

Referring now to FIG. 2, a second silicon substrate or support wafer 18 is provided, wafer 18 having an oxide layer 20 formed upon a surface thereof. Oxide layer 20 can comprise, for example, $SiO_2$. First wafer 10 is flipped over and placed in intimate contact with second wafer 18, prior to being wafer bonded. Wafer bonding is well known in the art and therefore only briefly discussed herein. Oxide layer 16 contacts with oxide layer 20. Wafers 10 and 18 are then subjected to a heat treatment for a predetermined period of time until oxide layer 16 and oxide layer 20 bond to form oxide layer 22, as shown in FIG. 3.

Figure 4:
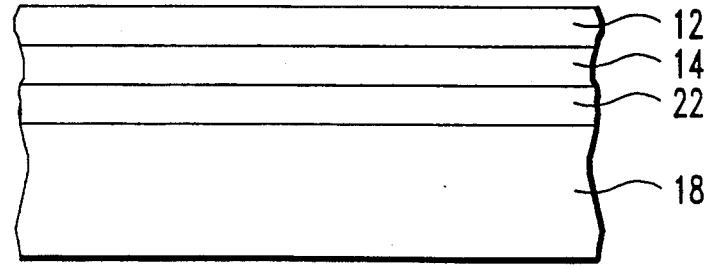

A structure as shown in FIG. 4 is subsequently obtained by controlled mechanical removal of the substrate or wafer 10. This can be accomplished by grinding and/or lapping of the wafer 10 to substantially remove the same, followed by chemical-mechanical polishing. Chemical-mechanical polishing facilitates the removal of any residual grinding and/or lapping damage which may have occurred to the silicon near diffusion layer 12. The residual grinding and/or lapping damage to the silicon near diffusion layer 12 is removed to prevent the same from propagating to the underlying diffusion layer 12 and epitaxial layer 14 during subsequent processing. Grinding, lapping, and chemical-mechanical polishing are well known in the art and therefor not discussed herein.

Figure 5:
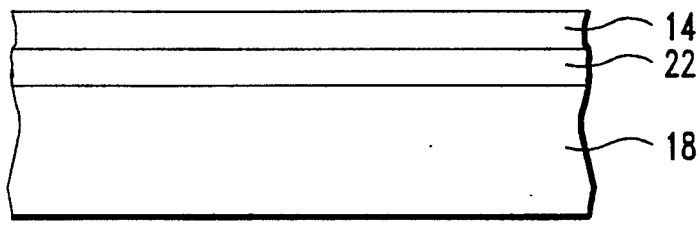

In the next step, diffusion layer 12 is selectively removed to expose underlying epitaxial layer 14 (FIG. 5), with minimal damage to the underlying epitaxial layer 14. In particular, the $N^+$ diffusion layer 12 is removed by any low energy "dry" plasma process well known in the art, such as, a $Cl_2$ plasma, for example. Such a low energy "dry" plasma process is characterized by a high etch selectivity between the diffusion layer 12 and the epitaxial layer 14, such that, the diffusion layer 12 is removed with minimal plasma damage to the epitaxial layer 14. Using $Cl_2$, an etching ratio $N^+/N^-$ of 40 can be obtained and any plasma damage which may result is minimal. This minimal plasma damage can be referred to as "shallow" plasma damage. While the step of removing diffusion layer 12 has been described with the use of a $Cl_2$ plasma, other low energy "dry" plasmas may likewise be used. An appropriate plasma is selected based upon the desired level of "shallow" plasma damage obtained in relation to the etch characteristics of layer 12, layer 14, and the selectivity of the particular etchant gas being considered.

Figure 6:
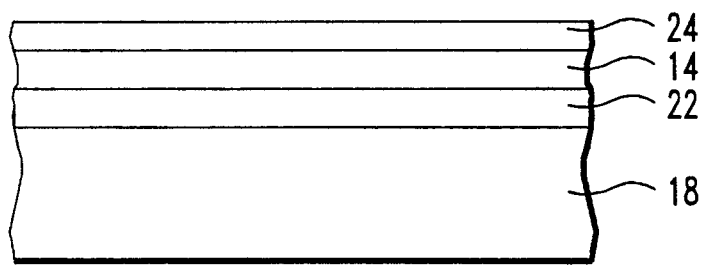
Figure 7:
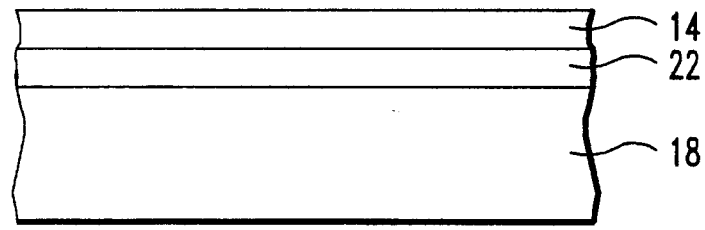

"Shallow" plasma damage resulting from the previous step can thereafter be removed by the forming of a sacrificial thermal oxide 24 upon the exposed epitaxial layer 14 (FIG. 6) and subsequent removal of the oxide 24 (FIG. 7). Formation of a thermal oxide layer is well known in the art. Thermal oxide layer 24 consumes the "shallow" plasma damage. Upon consumption of the "shallow" plasma damage, thermal oxide layer 24 is etched off by wet etching in buffered HF solutions. The resulting epitaxial layer 14 thus comprises a thin epitaxial layer having minimal defects.

Figure 8:
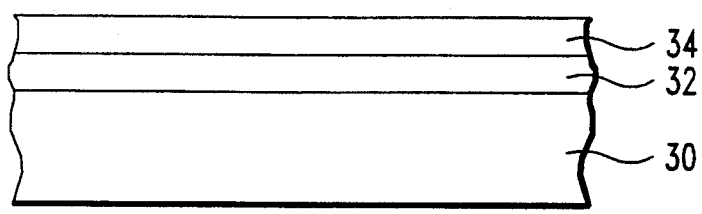
FIGS. 8 thru 14 are cross-sectional views of first and second silicon substrates at various process steps according to a second embodiment of the present invention.

In an alternate embodiment of the present invention, the method of forming a thin silicon SOI structure is substantially similar to the preferred embodiment with the following differences as discussed below. Referring now to FIG. 8, a first silicon substrate or wafer 30 comprises a first conductivity type, for example, a $P^-$ or $N^-$ substrate. A silicon diffusion layer 32 of a second conductivity type and having a first etch characteristic is formed upon wafer 30 by any conventional method. Diffusion layer 32 can comprise a 2 to 3 $\mu m$ wide $N^+$ diffusion layer. In addition, a thin epitaxial layer 34 of a second conductivity type, having a second etch characteristic which is different from the first etch characteristic of layer 32, is formed upon diffusion layer 32 by any well known low temperature silicon epitaxial process. Epitaxial layer 34 can comprise, for example, an $N^-$ doped layer having a thickness between 0.05 and 2 $\mu m$.

Figure 9:
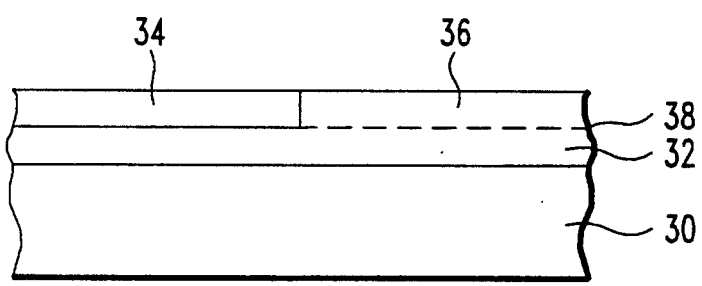

Referring now to FIG. 9, a desired region 36 of epitaxial layer 34 is doped to form a diffusion region of the second conductivity type and having an etch characteristic similar to the first etch characteristic of diffusion layer 32. While only one region 36 has been shown, it should be understood that many such regions can be similarly doped according to the requirements of a particular semiconductor wafer structure. Inherent in the formation of diffusion region 36, diffusion region 36 and diffusion layer 32 form a combined diffusion layer 38.

Figure 10:
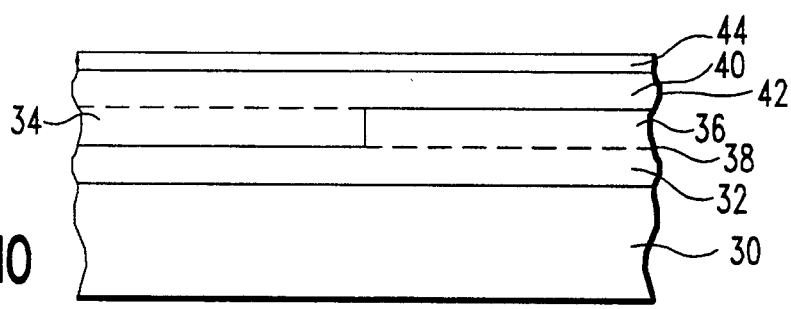

A second thin epitaxial layer 40 of a second conductivity type and having a second etch characteristic is similarly formed by LTE upon the first thin epitaxial layer 34 and the diffusion regions 36 (FIG. 10). Epitaxial layer 40 can comprise, for example, an $N^-$ doped epitaxial layer having a thickness between 0.05 and 2.0 $\mu m$. Inherent in the formation of epitaxial layer 40, epitaxial layer 40 and the underlying epitaxial layer 34 form a combined epitaxial layer 42 as shown in FIG. 10. A thin oxide layer 44 comprising, for example, $SiO_2$, is thereafter formed upon the epitaxial layer 42.

Figure 11:
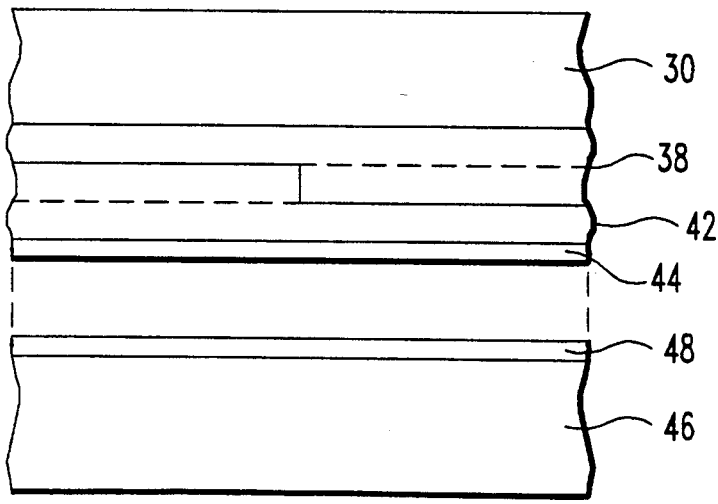
Figure 12:
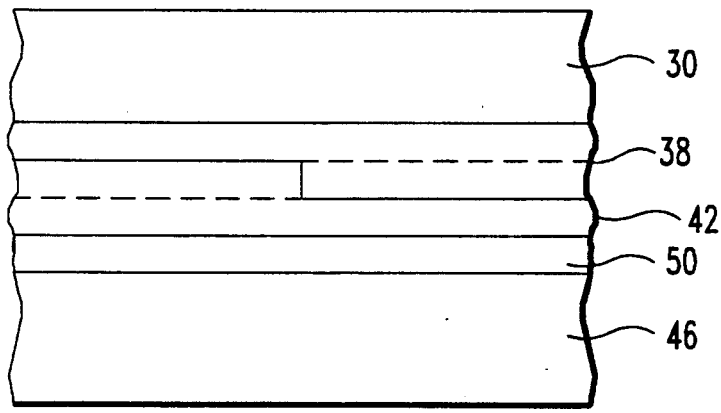

Referring now to FIG. 11, a second silicon substrate or support wafer 46 is provided, wafer 46 having an oxide layer 48 formed upon a surface thereof. Oxide layer 48 can comprise, for example, $SiO_2$. First wafer 30 is flipped over and placed in intimate contact with second wafer 46, prior to being wafer bonded. That is, oxide layer 44 contacts with oxide layer 48 and wafers 30 and 46 are then subjected to a heat treatment for a predetermined period of time until oxide layer 44 and oxide layer 48 bond to form combined oxide layer 50, as shown in FIG. 12.

Figure 13:
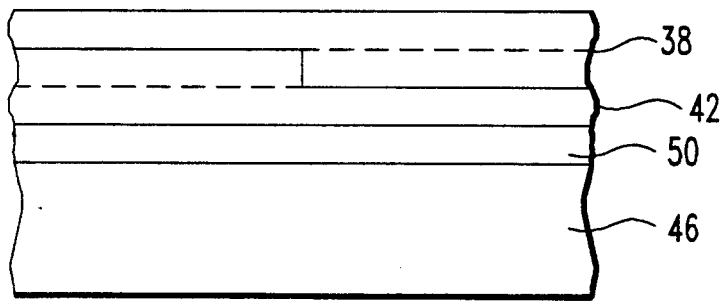

A structure as shown in FIG. 13 is subsequently obtained by the controlled mechanical removal of the substrate or wafer 30. Such removal is similar to the removal of wafer 10 in the method of the preferred embodiment, as discussed earlier.

In the next step, diffusion layer 38 is selectively removed to expose underlying epitaxial layer 42 (FIG. 14), with minimal damage to the underlying epitaxial layer 42. Selective removal of diffusion layer 38 is accomplished using a low energy "dry" plasma process, as discussed earlier with respect to the removal of diffusion layer 12 in the method of the preferred embodiment. The diffusion layer 38 is removed with minimal plasma damage to the epitaxial layer 42. Any resulting "shallow" plasma damage may subsequently be removed by growing a sacrificial oxide upon the epitaxial layer 42 and subsequently removing the sacrificial oxide, as discussed earlier with respect to removal of "shallow" plasma damage in the preferred embodiment.

Figure 14:
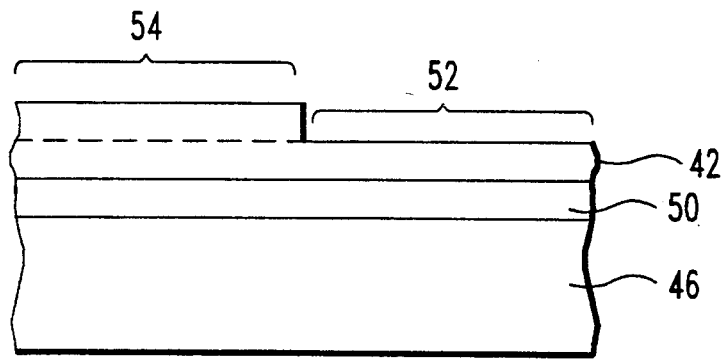

The resultant structure, as shown in FIG. 14, provides an epitaxial layer 42 having regions 52 and 54 of different thicknesses. For example, region 52 can comprise a layer having a thickness of between 0.05 and 2.0 $\mu m$ for the subsequent formation of CMOS semiconductor devices. Similarly, region 54 can comprise a layer having a thickness of between 0.1 and 4.0 $\mu m$ for the subsequent formation of bipolar semiconductor devices. As a result, the method of the alternate embodiment provides a structure having a thin silicon layer substantially free of defects which is suitable for BiCMOS semiconductor device applications.

Figure 15:
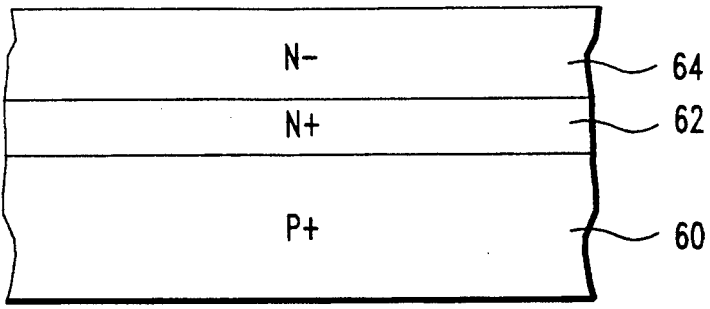
FIGS. 15 thru 21 are cross-sectional views of first and second silicon substrates at various process steps according to a third embodiment of the present invention.

In another alternate embodiment of the present invention, the method of forming a thin silicon SOI structure is substantially similar to the preferred embodiment with the following differences as discussed below. Referring now to FIG. 15, a first silicon substrate or wafer 60 comprises a first conductivity type, for example, a P⁻ or N⁻ substrate. A silicon diffusion layer 62 of a second conductivity type and having a first etch characteristic is formed upon wafer 60 by any conventional method. Diffusion layer 62 can comprise a 2 to 3 μm wide N+ diffusion layer. In addition, a thin epitaxial layer 64 of a second conductivity type, having a second etch characteristic which is different from the first etch characteristic of layer 62, is formed upon diffusion layer 62 by any well known low temperature silicon epitaxial process. Epitaxial layer 64 can comprise, for example, an N⁻ doped layer having a thickness between 0.05 and 4 μm.

Figure 16:
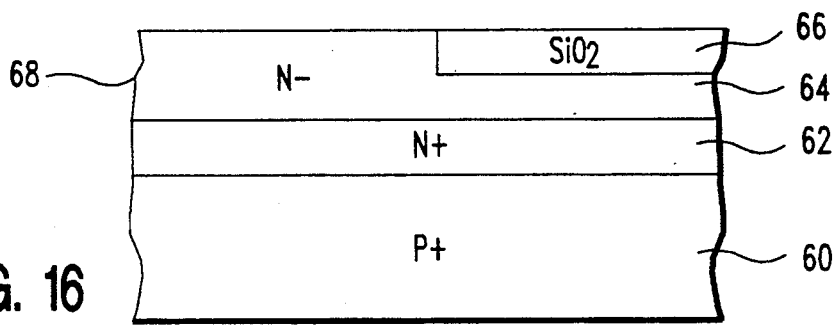
Figure 17:
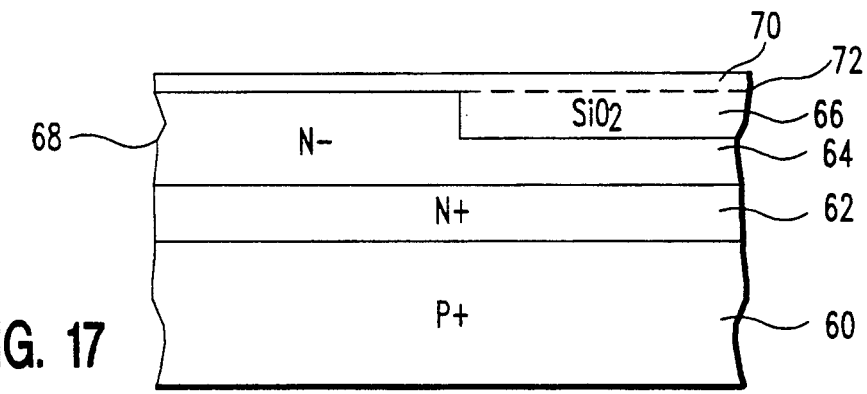

Referring now to FIG. 16, an oxide region 66 is formed in epitaxial layer 64 to form an oxide patterned epitaxial layer 68. Oxide region 66 can comprise, for example, SiO₂ and can be formed by any conventional method known in the art such as described in commonly assigned U.S. Pat. No. 4,671,851 incorporated herein by reference. While only one region 66 has been shown, it should be understood that many such regions can be similarly formed according to the requirements of a particular semiconductor wafer structure. A thin oxide layer 70 comprising, for example, CVD SiO₂, is thereafter formed upon the epitaxial layer 68 and oxide region 66 (FIG. 17). Inherent in the formation of oxide layer 70, oxide region 66 and oxide layer 70 combine to form oxide layer 72 having a planar surface. Alternatively, oxide region 66 may be formed by first depositing a polish stop layer (not shown) upon layer 64. The polish stop layer could comprise a nitride layer having a thickness of approximately 0.01 μm. Layer 64 and the polish stop layer are then patterned and etched to a predetermined desired depth to form a shallow trench. The trench is subsequently filled with oxide and polished back to the polish stop layer. A thin oxide layer 70, comprising CVD oxide, is then deposited upon the polished surface of the polish stop layer and oxide region 66.

Figure 18:
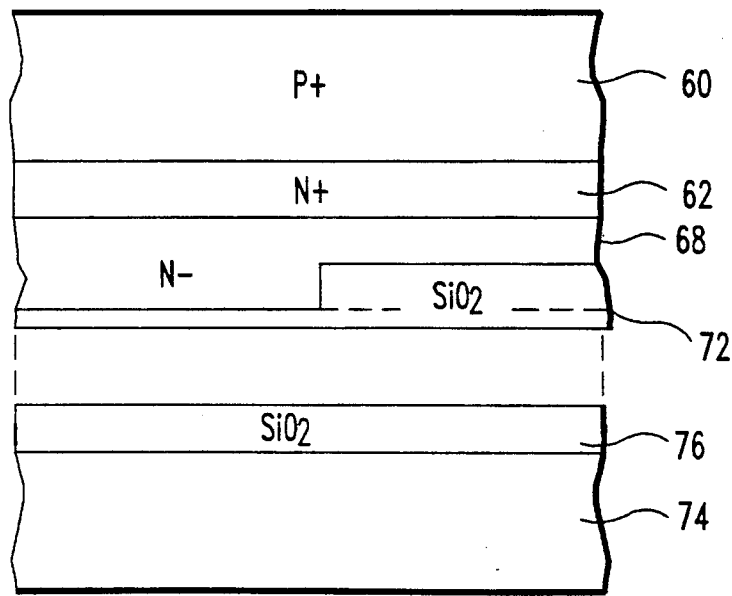
Figure 19:
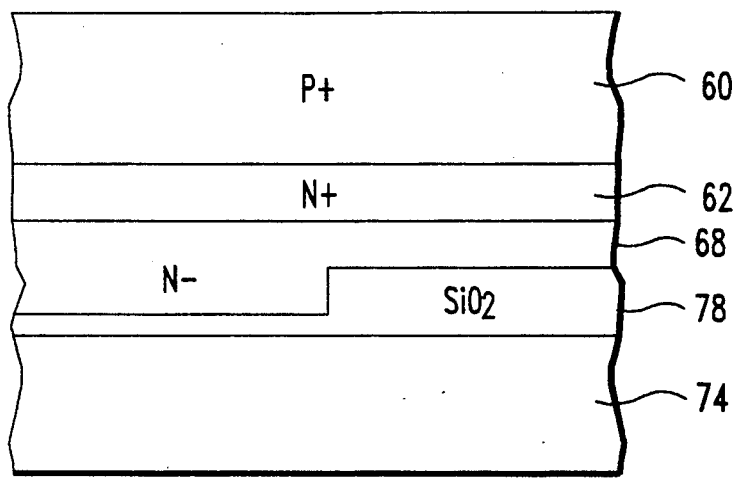

Referring now to FIG. 18, a second silicon substrate or support wafer 74 is provided, wafer 74 having an oxide layer 76 formed upon a surface thereof. Oxide layer 76 can comprise, for example, SiO₂. First wafer 60 is flipped over and placed in intimate contact with second wafer 74, prior to being wafer bonded. That is, oxide layer 72 contacts with oxide layer 76 and wafers 60 and 74 are then subjected to a heat treatment for a predetermined period of time until oxide layer 72 and oxide layer 76 bond to form combined oxide layer 78, as shown in FIG. 19.

Figure 20:
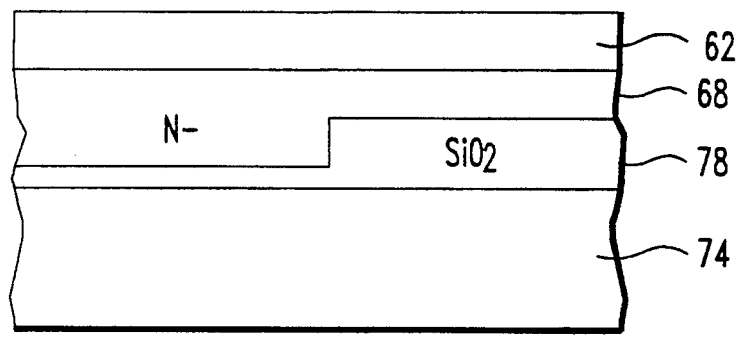

A structure as shown in FIG. 20 is subsequently obtained by the controlled mechanical removal of the substrate or wafer 60. Such removal is similar to the removal of wafer 10 in the method of the preferred embodiment, as discussed earlier.

In the next step, diffusion layer 62 is selectively removed to expose underlying epitaxial layer 68 (FIG. 21), with minimal damage to the underlying epitaxial layer 68. Selective removal of diffusion layer 62 is accomplished using a low energy "dry" plasma process, as discussed earlier with respect to the removal of diffusion layer 12 in the method of the preferred embodiment. The diffusion layer 62 is removed with minimal plasma damage to the epitaxial layer 68. Any resulting "shallow" plasma damage may subsequently be removed by growing a sacrificial oxide upon the epitaxial layer 68 and subsequently removing the sacrificial oxide, as discussed earlier with respect to removal of "shallow" plasma damage in the preferred embodiment.

Figure 21:
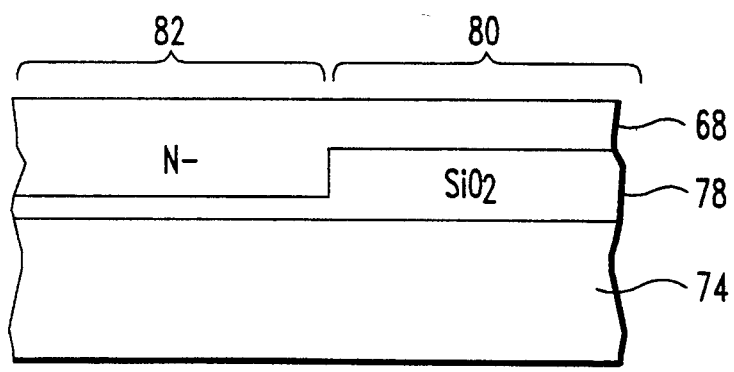

The resultant structure, as shown in FIG. 21, provides an epitaxial layer 68 having regions 80 and 82 of different thicknesses. For example, region 80 can comprise a layer having a thickness of between 0.05 and 0.2 μm for the subsequent formation of CMOS semiconductor devices. Similarly, region 82 can comprise a layer having a thickness of between 0.1 and 4.0 μm for the subsequent formation of Bipolar semiconductor devices. As a result, the method of the second alternate embodiment provides a structure having a thin silicon layer substantially free of defects which is suitable for BiCMOS semiconductor device applications.

There is thus provided a method of making a thin silicon SOI layer formed by wafer bonding which overcomes the problems of prior known methods. The silicon SOI layer formed is substantially free of defects. Etch pits are minimized during the etching of the diffusion layer and plasma damage can be easily removed using a sacrificial oxide technique.

While the invention has been particularly shown and described with reference to the preferred and alternate embodiments thereof, it will be understood by those skilled in the art that various changes in form and detail may be made therein without departing from the spirit and scope of the invention.

What is claimed is:

1. A method of forming a thin semiconductor layer substantially free of defects upon which semiconductor structures can be subsequently formed, comprising the steps of:

a) providing a first wafer comprising a silicon substrate of a first conductivity type, a diffusion layer of a second conductivity type formed thereon and having a first etch characteristic, a thin epitaxial layer of the second conductivity type formed upon the diffusion layer and having a second etch characteristic different from the first etch characteristic of the diffusion layer, and a thin oxide layer formed upon the thin epitaxial layer;

b) providing a second wafer comprising a silicon substrate having a thin oxide layer formed on a surface thereof;

c) wafer bonding said first wafer to said second wafer;

d) removing the silicon substrate of said first wafer in a controlled mechanical manner; and e) removing the diffusion layer of said first wafer using a selective low energy dry plasma process to expose the underlying thin epitaxial layer, the selective dry plasma process providing an etch ratio of the first etch characteristic to the second etch characteristic such that the diffusion layer is removed with minimal formation of any shallow plasma radiation damage to the expose underlying thin epitaxial layer.

2. The method of forming a thin semiconductor layer according to claim 1, wherein the step of providing a first wafer comprises providing a silicon substrate, an N+ diffusion layer formed thereon, a thin N⁻ epitaxial layer of a desired thickness formed upon the N+ diffusion layer, and a thin oxide layer formed upon the thin N⁻ epitaxial layer.

3. The method of forming a thin semiconductor layer according to claim 1, wherein the step of providing a first wafer comprises providing a silicon substrate, an N+ diffusion layer formed thereon, an N⁻ epitaxial layer of a desired thickness in the range of 0.05 to 2.0 µm formed upon the N+ diffusion layer, and a thin oxide layer formed upon the thin N− epitaxial layer.

4. The method of forming a thin semiconductor layer according to claim 1 wherein the step of removing the diffusion layer of said first wafer using a selective low energy dry plasma process comprises using a Cl₂ plasma wherein an etching ratio N+/N− of 40 can be obtained.

5. The method of forming a thin semiconductor layer according to claim 1, further comprising the step of:
   f) removing shallow plasma radiation damage from the exposed surface of the thin epitaxial layer.

6. The method of forming a thin semiconductor layer according to claim 5, wherein the step of providing a first wafer comprises providing a P-type silicon substrate, an N+ diffusion layer formed thereon, a thin N− epitaxial layer of a desired thickness formed upon the N+ diffusion layer, and a thin oxide layer formed upon the thin N− epitaxial layer.

7. The method of forming a thin semiconductor layer according to claim 5, wherein the step of providing a first wafer comprises providing a silicon substrate, an N+ diffusion layer formed thereon, an N− epitaxial layer of a desired thickness in the range of 0.05 to 2.0 µm formed upon the N+ diffusion layer, and a thin oxide layer formed upon the thin N− epitaxial layer.

8. The method of forming a thin semiconductor layer according to claim 5 wherein the step of removing the diffusion layer of said first wafer using a selective dry low energy plasma process comprises using a Cl₂ plasma wherein an etching ratio N+/N− of 40 can be obtained.

9. A method of forming a thin semiconductor layer substantially free of defects upon which semiconductor structures can be subsequently formed, comprising the steps of:
   a) forming a silicon diffusion layer upon a first wafer, the first wafer comprising a silicon substrate of a first conductivity type and the diffusion layer being of a second conductivity type and characterized by a first etch characteristic;
   b) forming a first thin epitaxial layer upon said diffusion layer, said first thin epitaxial layer being of the second conductivity type and characterized by a second etch characteristic different from the first etch characteristic of said diffusion layer;
   c) doping said first thin epitaxial layer in predetermined regions to form diffusion regions therein, said diffusion regions being of the second conductivity type and characterized by the first etch characteristic;
   d) forming a second thin epitaxial layer upon said first thin epitaxial layer, said second thin epitaxial layer being of the second conductivity type and characterized by the second etch characteristic;
   e) forming a thin oxide layer upon said second thin epitaxial layer;
   f) providing a second wafer comprising a silicon substrate having a thin oxide layer formed on a surface thereof;
   g) wafer bonding said first wafer to said second wafer;
   h) removing the silicon substrate of said first wafer in a controlled mechanical manner; and
   i) removing said diffusion layer and said diffusion regions of said first wafer using a selective low energy dry plasma process to expose areas of the underlying first and second thin epitaxial layers in contact with said diffusion layer and said diffusion regions, respectively, the selective dry plasma process providing an etch ratio of the first etch characteristic to the second etch characteristic such that said diffusion layer and diffusion regions are removed with minimal formation of any shallow plasma radiation damage to the exposed areas of the underlying first and second thin epitaxial layers, respectively.

10. The method of forming a thin semiconductor layer according to claim 9, wherein:
   step a) comprises forming an N+ diffusion layer upon the silicon substrate;
   step b) comprises forming a first thin N− epitaxial layer of a first desired thickness upon the N+ diffusion layer;
   step c) comprises doping the first thin epitaxial layer with N+ arsenic in the predetermined regions; and
   step d) comprises forming a second thin N− epitaxial layer of a second desired thickness upon the first thin N− epitaxial layer.

11. The method of forming a thin semiconductor layer according to claim 10, wherein the first and second desired thickness's of the first and second thin N− epitaxial layers are in the range of 0.05 to 2.0 µm.

12. The method of forming a thin semiconductor layer according to claim 9 wherein
   step i) comprises removing the diffusion layer and the diffusion regions of said first wafer with a selective low energy dry Cl₂ plasma wherein an etching ratio N+/N− of 40 can be obtained.

13. The method of forming a thin semiconductor layer according to claim 9, further comprising the step of:
   j) removing shallow plasma radiation damage from the exposed surfaces of said first and second thin epitaxial layers.

14. The method of forming a thin semiconductor layer according to claim 13, wherein:
   step a) comprises forming an N+ diffusion layer upon the silicon substrate;
   step b) comprises forming a first thin N− epitaxial layer of a first desired thickness upon the N+ diffusion layer;
   step c) comprises doping the first thin epitaxial layer with N+ arsenic to form predetermined diffusion regions; and
   step d) comprises forming a second thin N− epitaxial layer of a second desired thickness upon the first thin N− epitaxial layer.

15. The method of forming a thin semiconductor layer according to claim 14, wherein the first and second desired thickness's of the first and second thin N− epitaxial layers are in the range of 0.05 to 2.0 µm.

16. The method of forming a thin semiconductor layer according to claim 13 wherein
   step i) comprises removing the diffusion layer and the diffusion regions with a selective low energy dry Cl₂ plasma wherein an etching ratio N+/N− of 40 can be obtained.

17. A method of forming a thin semiconductor layer substantially free of defects upon which semiconductor structures can be subsequently formed, comprising the steps of:
   a) forming a silicon diffusion layer upon a first wafer, the first wafer comprising a silicon substrate of a first conductivity type and the diffusion layer being of a second conductivity type and characterized by a first etch characteristic;

b) forming an epitaxial layer upon said diffusion layer, said epitaxial layer being of the second conductivity type and characterized by a second etch characteristic different from the first etch characteristic of said diffusion layer;

c) forming trenches in said epitaxial layer at predetermined regions therein;

d) filling said trenches with a trench fill;

e) planarizing a top surface of said epitaxial layer and said filled trenches;

f) forming a thin oxide layer upon said planarized epitaxial layer and filled trenches;

g) providing a second wafer comprising a silicon substrate having a thin oxide layer formed on a surface thereof;

h) wafer bonding said first wafer to said second wafer;

i) removing the silicon substrate of said first wafer in a controlled mechanical manner; and j) removing said diffusion layer of said first wafer using a selective dry low energy plasma process to expose the underlying epitaxial layer, the selective dry plasma process providing an etch ratio of the first etch characteristic to the second etch characteristic such that said diffusion layer is removed with minimal formation of any shallow plasma radiation damage to the exposed underlying epitaxial layer.

18. The method of forming a thin semiconductor layer according to claim 17, wherein:

step a) comprises forming an $N^+$ diffusion layer upon the silicon substrate; and step b) comprises forming a $N^-$ epitaxial layer of a desired thickness upon the $N^+$ diffusion layer.

19. The method of forming a thin semiconductor layer according to claim 18, wherein the desired thickness of the $N^-$ epitaxial layer is in the range of 0.05 to 2.0 $\mu$m.

20. The method of forming a thin semiconductor layer according to claim 17 wherein step j) comprises removing the diffusion layer of said first wafer with a selective dry low energy $Cl_2$ plasma wherein an etching ratio $N^+/N^-$ of 40 can be obtained.

21. The method of forming a thin semiconductor layer according to claim 17, further comprising the step of:

k) removing shallow plasma radiation damage from the exposed surface of the epitaxial layer.

22. The method of forming a thin semiconductor layer according to claim 21, wherein:

step a) comprises forming an $N^+$ diffusion layer upon the silicon substrate; and step b) comprises forming a $N^-$ epitaxial layer of a desired thickness upon the $N^+$ diffusion layer.

23. The method of forming a thin semiconductor layer according to claim 22, wherein the desired thickness of the $N^-$ epitaxial layer is in the range of 0.05 to 2.0 $\mu$m.

24. The method of forming a thin semiconductor layer according to claim 21 wherein step j) comprises removing the diffusion layer of said first wafer with a selective dry low energy $Cl_2$ plasma wherein an etching ratio $N^+/N^-$ of 40 can be obtained.

* * * * *

UNITED STATES PATENT AND TRADEMARK OFFICE
CERTIFICATE OF CORRECTION

PATENT NO. : 5,234,535
DATED : August 10, 1993
INVENTOR(S) : Klaus D. Beyer, Louis L. Hsu, Victor J. Silvestri, Andrie S. Yapsir It is certified that error appears in the above-identified patent and that said Letters Patent is hereby corrected as shown below:

On the title page, [75] Inventors: please correct the spelling of "Pleasane Valley" to --Pleasant Valley--.

In column 6, line 56: change "expose" to --exposed--.

Signed and Sealed this

Fifth Day of April, 1994

Attest:

Attesting Officer

BRUCE LEHMAN

Commissioner of Patents and Trademarks